US005483737A

United States Patent [19]
Tran et al.

[11] Patent Number: 5,483,737
[45] Date of Patent: Jan. 16, 1996

[54] ELECTRICAL SHUNT AND TOOL FOR INSTALLING SAME

[75] Inventors: Mai-Loan Tran, Harrisburg; Edward J. Bright, Middletown; Attalee S. Taylor, Palmyra, all of Pa.

[73] Assignee: The Whitaker Corporation, Wilmington, Del.

[21] Appl. No.: 257,595

[22] Filed: Jun. 9, 1994

[51] Int. Cl.$^6$ ............................................ H01R 43/00
[52] U.S. Cl. ........................ 29/747; 29/450; 29/758; 29/881
[58] Field of Search ................ 439/507, 509–514; 29/747, 758, 764, 739, 450, 881

[56] References Cited

U.S. PATENT DOCUMENTS

| | | | |
|---|---|---|---|
| 4,194,256 | 3/1980 | Knickerbocker | 7/107 |
| 4,353,610 | 10/1982 | Deters | 339/19 |
| 4,380,118 | 4/1983 | Driver et al. | 29/247 |
| 4,399,608 | 8/1983 | Ingaglio | 29/747 |
| 4,414,736 | 11/1983 | Fieberg et al. | 29/747 |
| 4,516,817 | 5/1985 | Deters | 339/19 |
| 4,656,725 | 4/1987 | Knickerbocker | 29/566.4 |
| 5,071,362 | 12/1991 | Martens et al. | 439/188 |
| 5,169,337 | 12/1992 | Ortega et al. | 439/510 |

FOREIGN PATENT DOCUMENTS

H01R29/00  8/1993  WIPO .

*Primary Examiner*—Carl E. Hall
*Attorney, Agent, or Firm*—Robert J. Kapalka

[57] ABSTRACT

A shunt (20) for electrically joining terminal posts (12) each having a width (W) comprises a base (22) which is apertured (23) to freely receive the posts (12) therethrough, and arms (26) extending upwardly from opposite sides of the base (22) and converging to a constriction (28) between free ends (18) thereof. A dimension (D) of the constriction (28) is less than the width of the posts (12), whereby the posts may be captured between the free ends (18). The base (22) has ears (24) at opposite ends which extend beyond side edges (27) of the arms (26) and are adapted to be engaged by the tool (30). The tool comprises a body (32) and a separator (34) extending from the body. The separator (34) has a width (S) which is greater than the constriction dimension (D) but less than the width (W) of the posts. The separator (34) is insertable in the constriction (28) to resiliently deflect the arms (26) and thereby become engaged between the free ends (18) to frictionally retain the shunt (20) to the tool (30). An inserter (36) extending from the body substantially parallel to the separator (34) is arranged such that, when the separator (34) is engaged between the free ends (18), a leading end (37) of the inserter is engageable against the base (22) without the inserter (36) being engaged between the free ends (18).

12 Claims, 5 Drawing Sheets

5,483,737

ELECTRICAL SHUNT AND TOOL FOR INSTALLING SAME

FIELD OF THE INVENTION

The invention relates to an electrical shunt having spring arms for gripping terminal posts and having ears which are adapted to be engaged by an installation tool, and to an installation tool having a separator prong which can be captured between the spring arms and inserter prongs for exerting a force on the ears.

BACKGROUND OF THE INVENTION

Shunts are well-known for commoning together two or more terminal posts of an electrical header. A shunt typically is formed from a metallic element which clips to the posts to be commoned together, thereby retaining the shunt to the posts and providing a conductive path between the posts. As technology reduces the size of electrical devices, terminal posts are being made smaller and closer together, and the shunts are being reduced in size accordingly. For terminal posts on 0.050 inch center to center spacing, an appropriate shunt is approximately 0.100 inch long and 0.040 inch wide. A shunt of such small size is difficult to handle and apply to the posts. It is known to house the metallic shunt element in an insulative receptacle which facilitates handling and application of the shunt, but these devices are relatively more expensive to manufacture, may exceed space limitations on the electrical package, and may still be so small as to be difficult to handle and apply. There is a need for a miniature shunt having a low profile which is economical to produce and which can be applied to terminal posts by a simple tool with a minimum of difficulty.

SUMMARY OF THE INVENTION

The invention provides a shunt for electrically joining terminal posts each having a width, and a tool for installing the shunt. The shunt comprises a base which is apertured to freely receive the posts therethrough, and arms extending upwardly from opposite sides of the base and converging to a constriction between free ends thereof. A dimension of the constriction is less than the width of the posts, whereby the posts may be captured between the free ends. The base has ears at opposite ends which extend beyond side edges of the arms and are adapted to be engaged by the tool. The tool comprises a body and a separator extending from the body. The separator has a width which is greater than the constriction dimension but less than the width of the posts. The separator is insertable in the constriction to resiliently deflect the arms and thereby become engaged between the free ends to frictionally retain the shunt to the tool. An inserter extending from the body substantially parallel to the separator is arranged such that, when the separator is engaged between the free ends, a leading end of the inserter is engageable against the base without the inserter being engaged between the free ends. When the posts are received through the apertured base of the shunt, the shunt may be urged downwardly by the leading end of the inserter to cause entry and capture of the posts between the free ends, thereby releasing the separator from engagement between the free ends and permitting withdrawal of the tool. The inserter may comprise a pair of inserter prongs each of which has a leading end which is engageable with a respective one of the ears of the shunt.

BRIEF DESCRIPTION OF THE DRAWINGS

The invention will now be described by way of example with reference to the accompanying drawings in which like elements in different figures thereof are identified by the same reference numeral and wherein.

DETAILED DESCRIPTION OF THE PREFERRED EMBODIMENT

Figure 1:
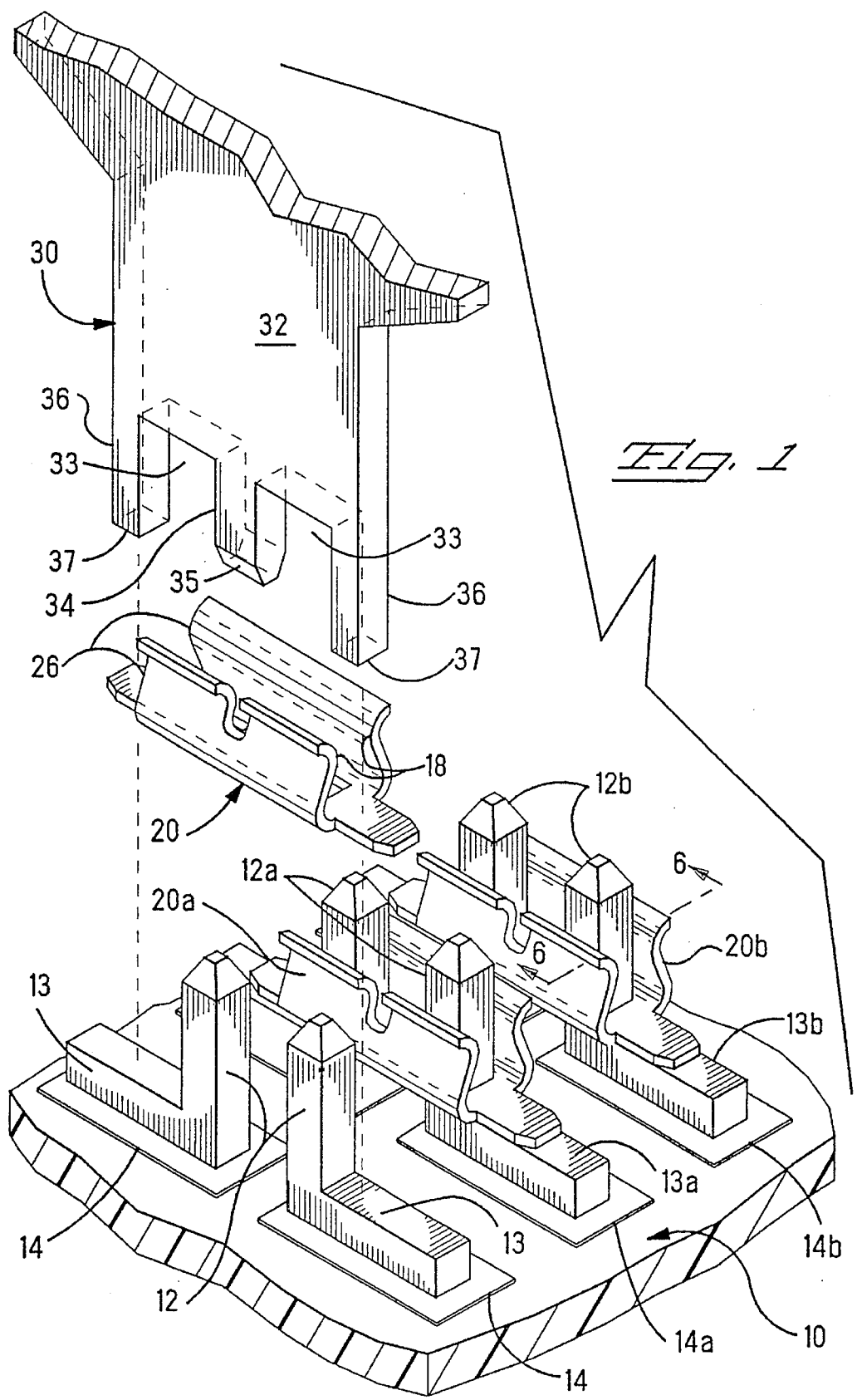
FIG. 1 is an isometric view of a shunt according to the invention which is disposed above terminal posts to which the shunt may be applied, and a shunt application tool according to the invention.

In FIG. 1, different letter suffixes are used with same reference numbers to distinguish different ones of multiple like elements. There is shown in FIG. 1 a cutaway portion of a circuit board 10 having three pairs of terminal posts 12, appear and 12b. The posts 12b are shown electrically joined or commoned by a shunt 20b, the posts 12a are commoned by a shunt 20a, and a shunt 20 according to the invention is disposed above the posts 12 for installation by a tool 30 according to the invention. The terminal posts 12, 12a, 12b shown in the drawing have a square cross-section and are a surface mount type have respective mounting feet 13, 13a, 13b which are surface mount soldered to respective contact pads 14, 14a, 14b at terminations of respective circuit traces (not shown) on the circuit board 10. However, it should become apparent to those skilled in the art that a shunt according to the invention may be applied to terminal posts having other cross-sectional shapes such as circular or rectangular, and that the shunt may also be used to common through-hole type posts which do not have the feet 13, 13a, 13b but which instead extend through and are soldered within plated through-holes in the circuit board, and the drawings are intended to be exemplary and not limiting as to the type or style of posts with which the invention may be used.

Figure 3:
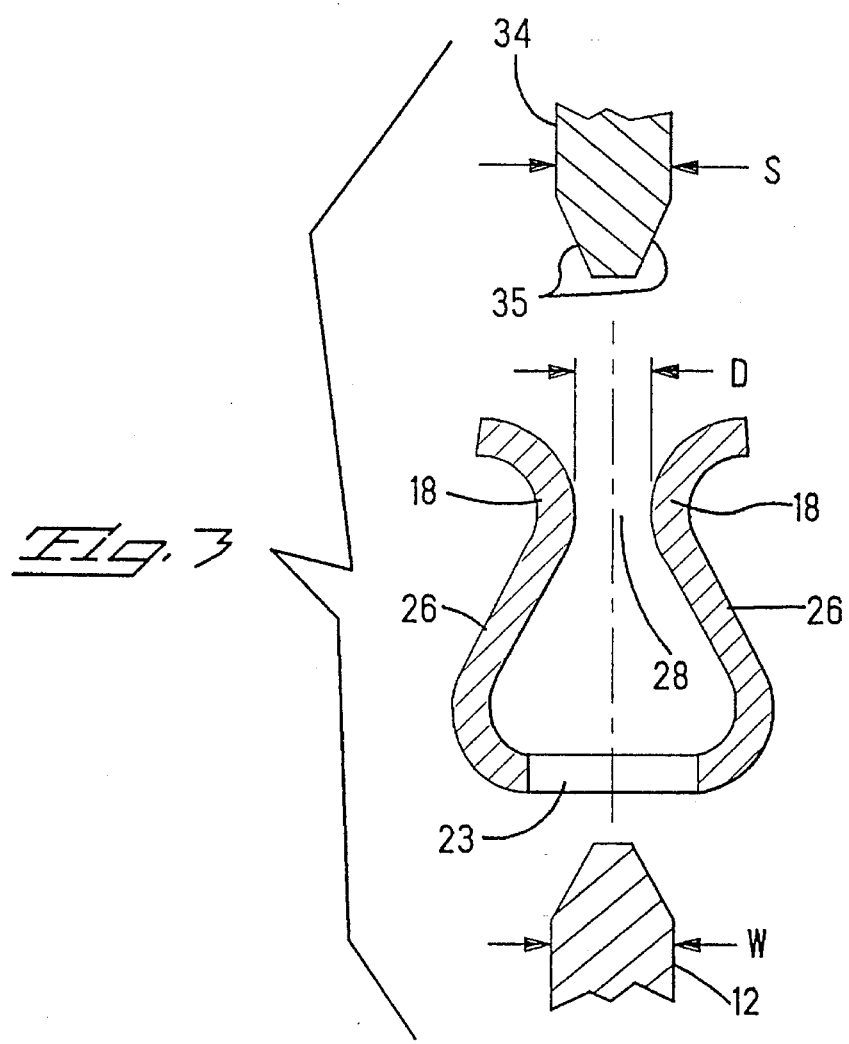
FIG. 3 is a cross-sectional view of the tool, the shunt, and one of the posts.

Referring now to FIG. 3, each of the terminal posts 12 has a known width W, and dimensions of the shunt 20 are selected to be appropriate for the width W of the posts being commoned.

Figure 2:
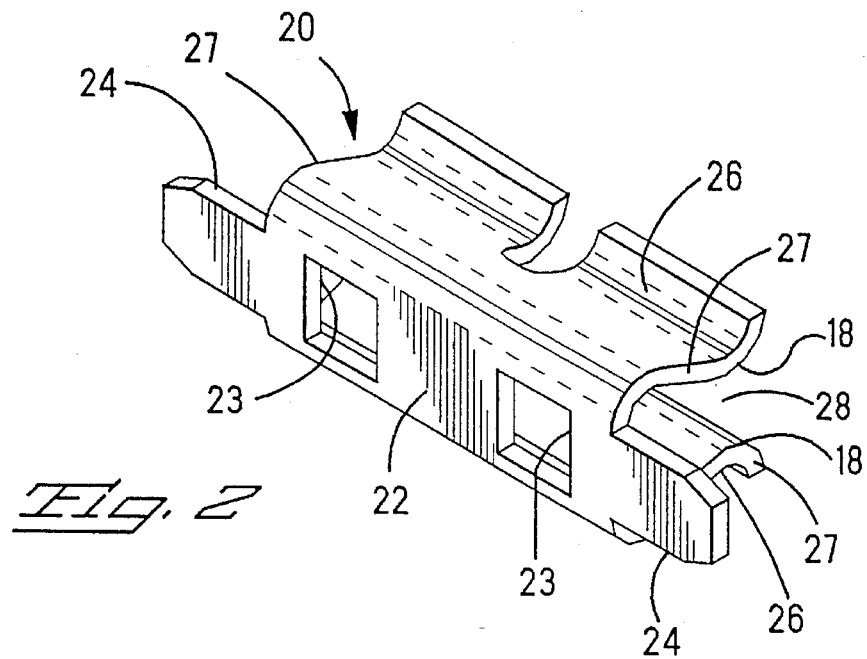
FIG. 2 is an isometric view of a bottom of the shunt.

As shown in FIGS. 2 and 3, the shunt 20 comprises a base 22 having apertures 23 which are dimensioned to freely receive the posts 12 therethrough. Arms 26 extend upwardly from opposite sides of the base 22 and converge to a constriction 28 between free ends 18 of the arms 26. At opposite ends of the base 22 are ears 24 which extend longitudinally beyond side edges 27 of the arms 26. The shunt 20 is stamped and formed from a single piece of metal, and the arms 26 are formed so that a dimension D across the constriction 28 is less than the width W of the posts 12. By way of example, for posts 12 having a width W of 0.016 inch, the dimension D is selected to be 0.010 inch. The shunt 20 is applied to the posts 12 by receiving the posts through the apertures 23 and urging the shunt downwardly to cause the posts to enter the constriction 28, thereby resiliently deflecting the arms 26 and capturing the posts between the free ends 18 due to normal forces of the free ends acting on the posts.

As shown in FIGS. 1 and 3, the tool 30 for installing the shunt is stamped from stainless steel stock and comprises a body 32 which may have an integral handle (not shown) or may be removably mounted, for example, in an Exacto knife handle. A separator 34 extending from the body has a width S which is selected to be greater than the constriction dimension D but less than the width W of the posts. In the present example the width S is 0.015 inch. The separator 34 has beveled leading edges 35 which enable the separator to be urged between the free ends 18 of the arms 26. The tool further includes an inserter which comprises a pair of inserter prongs 36 each having a leading end 37. The inserter prongs 36 extend from the tool body on respective opposite sides of the separator 34. The separator 34 is dimensioned for insertion between the pair of posts 12, and the inserter prongs 36 are spaced from the separator 34 so that the pair of posts 12 may be received in respective channels 33 between the separator 34 and the inserter prongs 36.

Figure 4:
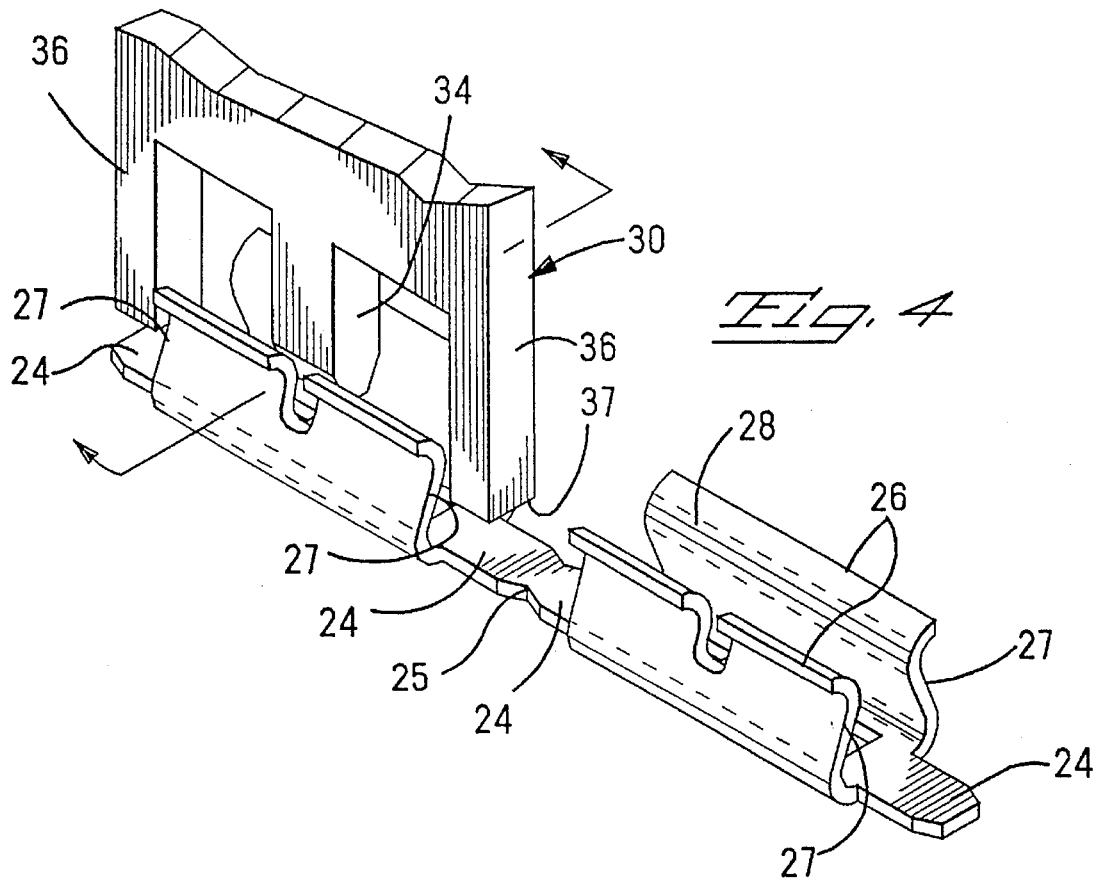
FIG. 4 is an isometric view of the tool being inserted into the first shunt of a strip of shunts.
Figure 5:
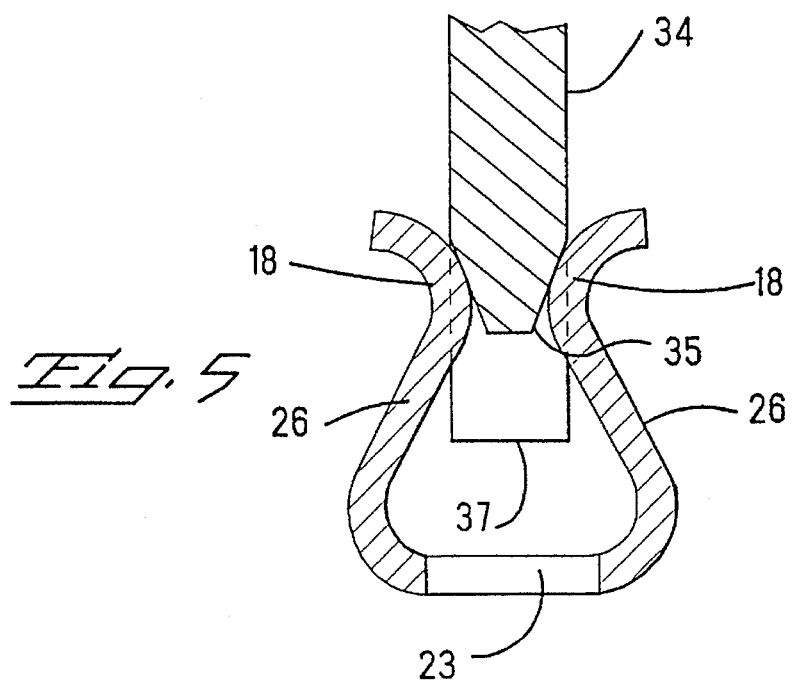
FIG. 5 is a cross-sectional view taken along line 5—5 of FIG. 4.

Referring to FIGS. 4 and 5, the shunt 20 is preferably produced in strip form with adjacent shunts 20 being joined at the ears 24 and there being a notch 25 between the ears 24 to facilite breaking off individual ones of the shunts from the strip. A person holding the tool 20 and working with the strip of shunts inserts the separator 34 of the tool between the free ends of the arms 26, thereby resiliently deflecting the arms 26 outwardly and expanding the constriction 28 until the full width of the separator becomes engaged in the constriction between the free ends. The inserter prongs are disposed beyond the opposite side edges 27 of the arms 26. In this manner, the leading ends 37 of the inserter prongs 36 can engage the ears 24 of the base without the inserter prongs extending through the constriction 28 and becoming engaged between the free ends 18 of the arms. The shunt 20 will be frictionally retained to the tool by the arms 26 engaging the separator 34 on opposite sides thereof. The shunt 20 is separable from the strip of shunts by flexing the strip at the notch 25 either before or after the shunt 20 has been applied to the posts of a connector.

Figure 6:
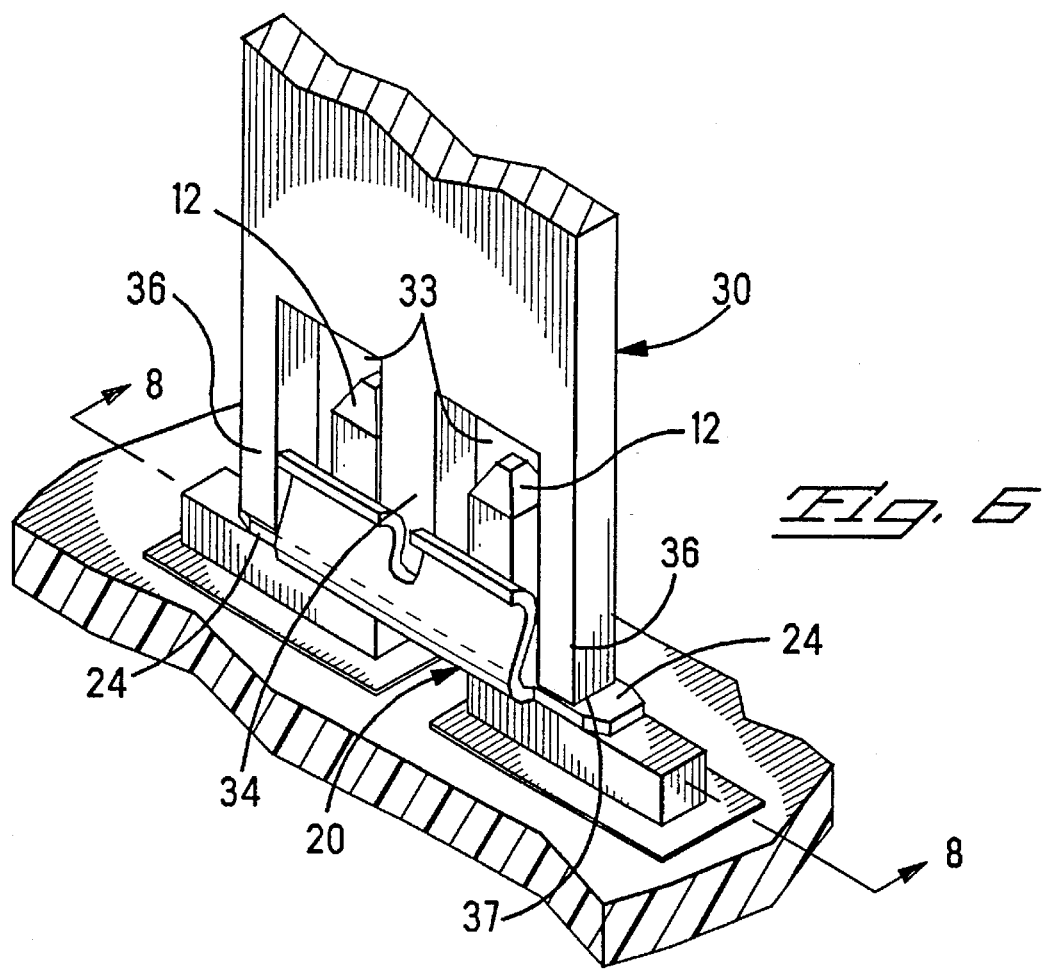
FIG. 6 is an isometric view of the shunt fully installed on terminal posts using the tool.
Figure 7:
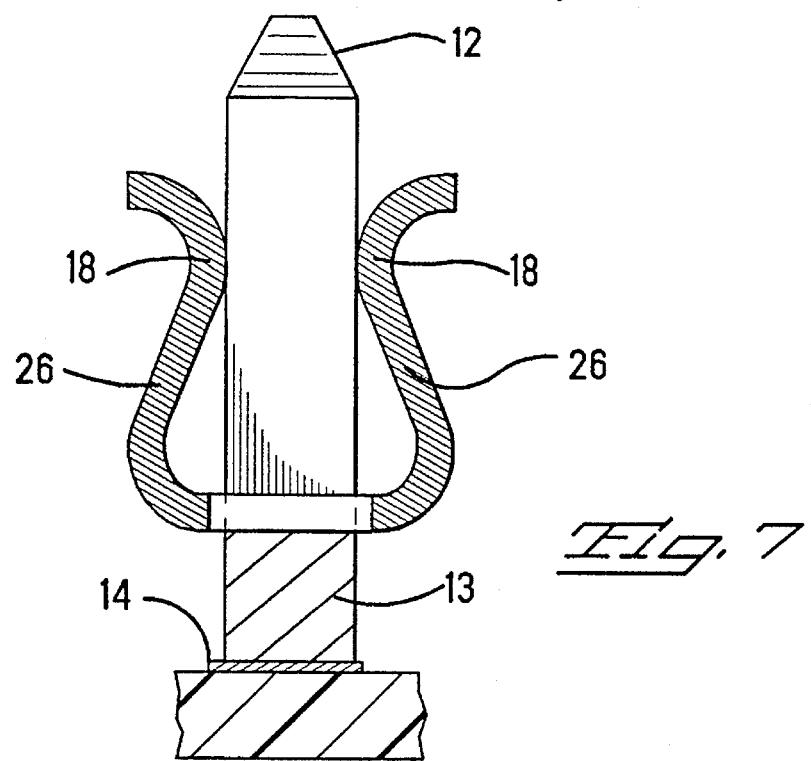
FIG. 7 is a cross-sectional view through FIG. 6.
Figure 8:
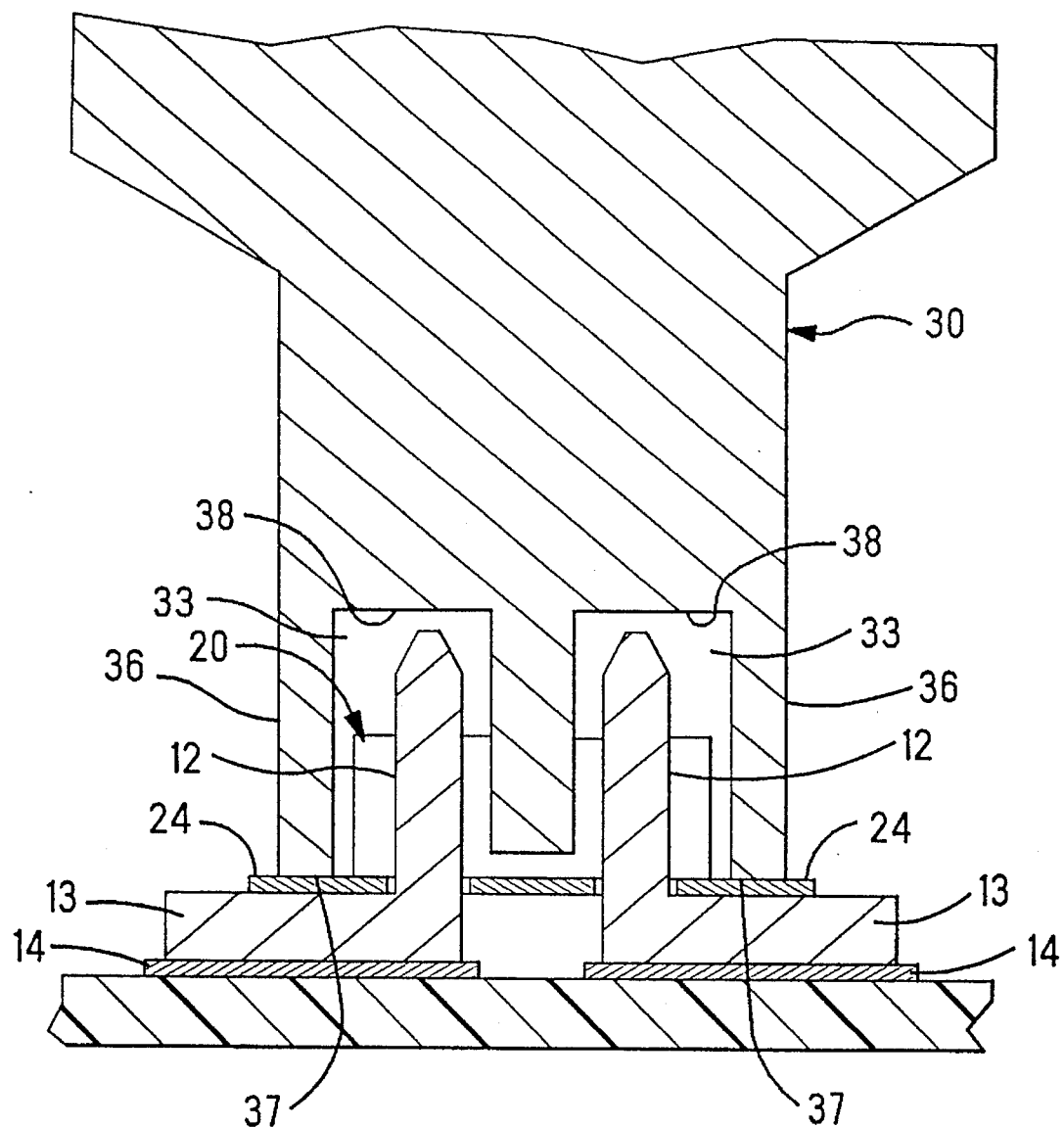
FIG. 8 is a cross-sectional view taken along line 8—8 of FIG. 6.

As shown in FIGS. 6–8, the shunt 20 can be applied over the posts 12 with the posts 12 being received through the apertures 23 and the separator 34 of the tool entering between the posts 12 as the shunt is urged downwardly. If at this time the inserter prongs 36 have not yet engaged their respective ears 24 on the shunt, entry of the posts 12 in the constriction between the arms 26 will frictionally retard the shunt until the leading ends 37 of the inserter prongs engage the ears 24. The shunt can then be pressed fully onto the posts with each of the posts 12 being received in one of the channels 33 between the separator 34 and one of the inserter prongs 36. As the free ends 18 of the shunt pass over the posts, the arms 26 are expanded further apart due to the width W of the posts being greater than the width S of the separator. The posts 12 become engaged in the constriction between the free ends 18 of the arms 26, thereby releasing the separator from engagement between the free ends of the arms 26 and permitting the tool to be withdrawn. If desired, distances from leading ends 37 of the inserter prongs to surfaces 38 of the channels 33 can be selected so that the surfaces 38 will act as stop surfaces which engage tops of the posts 12 to accurately control the depth to which the shunt 20 may be installed onto the posts.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A tool for installing an electrical shunt on terminal posts each having a width, the shunt having a base which is apertured to freely receive the posts therethrough, and arms extending upwardly from opposite sides of the base and converging to a constriction between free ends thereof, a dimension of the constriction being less than the width of the posts wherein the posts may be captured between the free ends, the tool comprising:

a body;

a separator extending from the body, the separator having a width which is greater than the constriction dimension but less than the width of the posts, the separator being insertable in the constriction to resiliently deflect the arms and thereby become engaged between the free ends to frictionally retain the shunt to the tool; and, an inserter extending from the body substantially parallel to the separator and arranged such that, when the separator is engaged between the free ends, a leading end of the inserter is engageable against the base without the inserter being engaged between the free ends;

wherein the posts may be received through the apertured base and the shunt may be urged downwardly by the leading end of the inserter to cause entry and capture of the posts between the free ends, thereby releasing the separator from engagement between the free ends and permitting withdrawal of the tool.

2. The tool according to claim 1, wherein the separator is insertable between a pair of the posts.

3. The tool according to claim 2, wherein the inserter comprises a pair of inserter prongs each having a said leading end and disposed on respective opposite sides of the separator.

4. The tool according to claim 3, wherein said inserter prongs are spaced from the separator such that said pair of posts may each be received between the separator and a respective one of said inserter prongs.

5. The tool according to claim 4, wherein said inserter prongs are arranged such that they do not extend through the constriction.

6. The tool according to claim 5, wherein said leading ends of said inserter prongs are disposed to engage ears of the base which extend beyond opposite side edges of the arms.

7. A system for shunting a pair of terminal posts each having a width, comprising:

a shunt having a base which is apertured to freely receive the posts therethrough, and arms extending upwardly from opposite sides of the base and converging to a constriction between free ends thereof, a dimension of the constriction being less than the width of the posts wherein the posts may be captured between the free ends; and a tool having:
a body;
a separator extending from the body, the separator having a width which is greater than the constriction dimension but less than the width of the posts, the separator being insertable in the constriction to resiliently deflect the arms and thereby become engaged between the free ends to frictionally retain the shunt to the tool; and, an inserter extending from the body substantially parallel to the separator and arranged such that, when the separator is engaged between the free ends, a leading end of the inserter is engageable against the base without the inserter being engaged between the free ends;

wherein the posts may be received through the apertured base and the shunt may be urged downwardly by the leading end of the inserter to cause entry and capture of the posts between the free ends, thereby releasing the separator from engagement between the free ends and permitting withdrawal of the tool.

8. The system according to claim 7, wherein the separator is insertable between a pair of the posts.

9. The system according to claim 8, wherein the inserter comprises a pair of inserter prongs each having a said leading end and disposed on respective opposite sides of the separator.

10. The system according to claim 9, wherein said inserter prongs are spaced from the separator such that said pair of posts may each be received between the separator and a respective one of said inserter prongs.

11. The system according to claim 10, wherein said inserter prongs are arranged such that they do not extend through the constriction.

12. The system according to claim 11, wherein said leading ends of said inserter prongs are disposed to engage ears of the base which extend beyond opposite side edges of the arms.

* * * * *